(12) United States Patent
Morton

(10) Patent No.: US 9,664,738 B2
(45) Date of Patent: May 30, 2017

(54) METHOD AND APPARATUS FOR IMPROVING EFFICIENCY OF TESTING INTEGRATED CIRCUITS

(71) Applicant: STMicroelectronics (Research & Development) Limited, Marlow (GB)

(72) Inventor: Gary Morton, Bristol (GB)

(73) Assignee: STMicroelectronics (Research and Development) Limited, Marlow (GB)

( * ) Notice: Subject to any disclaimer, the term of this patent is extended or adjusted under 35 U.S.C. 154(b) by 216 days.

(21) Appl. No.: 14/670,033

(22) Filed: Mar. 26, 2015

(65) Prior Publication Data
US 2015/0276874 A1    Oct. 1, 2015

(30) Foreign Application Priority Data

Mar. 27, 2014 (GB) .................................. 1405520.6

(51) Int. Cl.
G01R 31/28 (2006.01)
G01R 31/3177 (2006.01)
G01R 31/3185 (2006.01)

(52) U.S. Cl.
CPC . G01R 31/3177 (2013.01); G01R 31/318552 (2013.01); G01R 31/318572 (2013.01)

(58) Field of Classification Search
CPC ........ G01R 31/318541; G01R 31/3172; G01R 31/318335; G01R 31/318536; G01R 31/31855; G01R 31/318533
See application file for complete search history.

(56) References Cited

U.S. PATENT DOCUMENTS

| 6,393,592 | B1 | 5/2002 | Peeters et al. |
| 6,658,363 | B2* | 12/2003 | Mejia ............... G01R 31/31709 702/125 |
| 2005/0055615 | A1* | 3/2005 | Agashe .......... G01R 31/318552 714/727 |
| 2005/0055617 | A1 | 3/2005 | Wang et al. |
| 2007/0033465 | A1 | 2/2007 | Greenberg |
| 2007/0143653 | A1 | 6/2007 | Doorenbos et al. |
| 2007/0300108 | A1* | 12/2007 | Saint-Laurent G01R 31/318552 714/726 |
| 2011/0234283 | A1 | 9/2011 | Wu |
| 2014/0047293 | A1* | 2/2014 | Lamb ............. G01R 31/318555 714/727 |

FOREIGN PATENT DOCUMENTS

WO    2011/059439 A2    5/2011

* cited by examiner

*Primary Examiner* — David Ton
(74) *Attorney, Agent, or Firm* — Seed IP Law Group LLP

(57) ABSTRACT

A circuit, such as an integrated circuit or a die, has a first input pad configured to receive a multiplexed signal including scan data and a clock signal, a scan chain having a scan data input and a clock input and circuitry coupled between said first input pad and said scan chain. The circuitry is configured to extract the scan data and the clock signal from the received multiplexed signal, provide the extracted scan data to the scan data input of the scan chain, and provide the extracted clock signal to the clock input of the scan chain.

24 Claims, 7 Drawing Sheets

METHOD AND APPARATUS FOR IMPROVING EFFICIENCY OF TESTING INTEGRATED CIRCUITS

BACKGROUND

Technical Field

The present disclosure relates to a circuit, and in particular but not exclusively which may be used for testing. The circuit may be provided in the integrated circuit or die. This disclosure relates to a method of testing an integrated circuit.

Description of the Related Art

Despite advances in semiconductor process technology integrated circuits can be manufactured with faults. Just a single fault can render a circuit unusable and because of this manufacturers have implemented various techniques to identify where these circuits are faulty.

Integrated circuits can be tested by automated test equipment (ATE). The automated test equipment (ATE) typically works in response to a test sequence or input provided from an automatic test pattern generator (ATPG) which when applied to the circuit under test allows a distinction to be made between correct circuit behavior and faulty circuit behavior. ATPG patterns can in practice be used to attempt to detect faults such as a "stuck-at fault" where a signal line in the circuit is assumed to be stuck at a fixed logic value regardless of the inputs supplied to the circuit.

As integrated circuits have become larger, the amount of test circuitry required may be increased.

BRIEF SUMMARY

In an embodiment, an integrated circuit or die comprises: a first input pad configured to receive an input, said first input pad input comprises scan data multiplexed with a clock signal; a scan chain configured to receive said scan data and said clock signal, a circuit provided between said first input pad and said scan chain configured to provide from said input a first output and a second output, said first output providing said scan data and said second output providing said clock signal.

The circuit may comprise a first part having an enable input and a second input to receive said first input pad input, said first part being configured to provide said second output.

The first part may comprise a logic gate, said enable inputs and said second inputs being inputs to said gate and said second output being an output of said gate.

The logic gate may comprise an AND gate.

The circuit may comprise a second part having a data input and configured to provide said first output.

The second part may comprise a flip flop, a data input of said flip flop configured to receive said first input pad input and a data output of said flip flop configured to provide said first output.

The second part may be configured to receive a control clock input.

A clock input of said flip flop may be configured to receive said control clock input.

At least one of said control clock input and said enable input may be provided by one or more input pads different to said first input pad.

The input may be received from a tester and one tester cycle may be employed to provide one value of said scan data and its associated clock signal.

The input may be received from a tester and two tester cycles may be employed to provide one value of said scan data and its associated clock signal.

In an embodiment, a tester apparatus comprises: a test pattern generator configured to generate test pattern data for testing of an integrated circuit or die having a first input pad configured to receive an input, said generated test pattern data comprising said scan data multiplexed with said clock data for applying to said first input pad; a memory configured to store said scan test pattern; and an output configured to output said generated test pattern data.

In an embodiment, a method comprises: applying an input to a first input pad of an integrated circuit or die, said input comprising scan data multiplexed with a clock signal, wherein one or two tester cycles are employed to provide one value of said scan data and its associated clock signal.

In an embodiment, a tester apparatus comprises: a memory configured to store test data to be applied to a first input pad of an integrated circuit or die, said test data comprising scan data multiplexed with a clock signal, an output configured to output said test data to said first input pad, wherein one or two tester cycles is required to provide one value of said scan data and its associated clock signal.

In an embodiment, a circuit comprises: a first input pad configured to receive a multiplexed signal including scan data and clock data; a scan chain having a scan data input and a clock input; and circuitry coupled between said first input pad and said scan chain and configured to: extract the scan data and a clock signal from the received multiplexed signal; provide the extracted scan data to the scan data input of the scan chain; and provide the extracted clock signal to the clock input of the scan chain. In an embodiment, the circuitry comprises: logic having an enable input and a second input coupled to said first input pad and configured to provide the extracted clock signal to the clock input of the scan chain. In an embodiment, the circuit comprises: an enable-signal input pad configured to receive an enable signal, the enable-signal input pad being coupled to the enable input of the logic. In an embodiment, said logic comprises an AND gate. In an embodiment, the circuitry comprises: a flip flop, a data input of said flip flop configured to receive said multiplexed signal and a data output of said flip flop configured to provide the extracted scan data to the scan data input of the scan chain. In an embodiment, a clock input of said flip flop is configured to receive a control clock signal. In an embodiment, the circuit comprises: a control-clock input pad configured to receive said control clock signal and coupled to the clock input of the flip flop. In an embodiment, the circuit comprises: an enable-signal input pad configured to receive an enable signal, the enable-signal input pad being coupled to the enable input of the logic. In an embodiment, wherein the circuit is at least one of: an integrated circuit; and a die. In an embodiment, the first input pad is configured to receive the multiplexed signal from a testing apparatus and the circuitry is configured to extract one value of a scan vector and an associated clock pulse from the multiplexed signal in each cycle of the testing apparatus. In an embodiment, the first input pad is configured to receive the multiplexed signal from a testing apparatus and the circuitry is configured to extract one value of a scan vector and an associated clock pulse from the multiplexed signal every two cycles of the testing apparatus.

In an embodiment, an apparatus comprises: one or more processing devices configured to generate a signal to test a circuit having a scan chain and an input pad to receive the generated signal, said generated signal multiplexing scan data and clock data; and a memory coupled to the one or more processing devices and configured to store data to generate the signal multiplexing scan data and clock data. In an embodiment, the apparatus comprises: translation circuitry configured to couple between the one or more processing devices and the input pad of the circuit having a scan chain. In an embodiment, the apparatus comprises: testing circuitry configured to couple between the translation circuitry and the input pad of the circuit having a scan chain. In an embodiment, the circuit having a scan chain is an integrated circuit or die and the generated signal is a signal to test the scan chain of the integrated circuit or die.

In an embodiment, a method comprises: receiving a multiplexed signal including scan data and clock data on a first input pad of a circuit; extracting the scan data from the received multiplexed signal; extracting a clock signal from the received multiplexed signal; providing the extracted scan data to a scan data input of a scan chain of the circuit; and providing the extracted clock signal to a clock input of the scan chain of the circuit. In an embodiment, the method comprises: extracting the clock signal from the multiplexed signal based on an enable signal. In an embodiment, the method comprising: receiving the enable signal on an enable-signal input pad of the circuit. In an embodiment, the method comprises: extracting the scan data based on a control-clock signal. In an embodiment, the method comprises: receiving the control-clock signal on a control-clock-signal input pad of the circuit. In an embodiment, the method comprises: generating the multiplexed signal using a testing apparatus coupled to the circuit; and extracting one value of a scan vector and an associated clock pulse from the multiplexed signal in each cycle of the testing apparatus. In an embodiment, the method comprises: generating the multiplexed signal using a testing apparatus coupled to the circuit; and extracting one value of a scan vector and an associated clock pulse from the multiplexed signal in every two cycles of the testing apparatus.

A computer program comprising program code means adapted to perform the method may also be provided. The computer program may be stored and/or otherwise embodied by means of a carrier medium. In an embodiment, a non-transitory computer-readable medium's contents configure one or more processing devices to perform one or more methods disclosed herein.

In this disclosure, many different embodiments have been described. It should be appreciated that further embodiments may be provided by the combination of any two or more of the embodiments described herein.

BRIEF DESCRIPTION OF THE SEVERAL VIEWS OF THE DRAWINGS

For a better understanding of some embodiments, reference will now be made by way of example only to the accompanying Figures in which.

DETAILED DESCRIPTION

In the ensuing description, numerous specific details are provided in order to facilitate as much as possible understanding of the embodiments provided by way of example. The embodiments may be implemented with or without specific details, or else with other methods, components, materials, etc. In other cases, structures, materials, or operations that are well known are not shown or described in detail so that aspects of the embodiments will not be obscured. Reference in the framework of the present description to "an embodiment" or "one embodiment" means that a given peculiarity, structure, or characteristic described in connection with the embodiment is comprised in at least one embodiment. Hence, recurrence of phrases such as "in an embodiment" or "in one embodiment" in various points of the present description does not necessarily refer to one and the same embodiment. Moreover, the peculiarities, structures, or characteristics may be combined in any convenient way in one or more embodiments.

The notations and references are here provided only for convenience of the reader and do not define the scope or the meaning of the embodiments.

Figure 1:
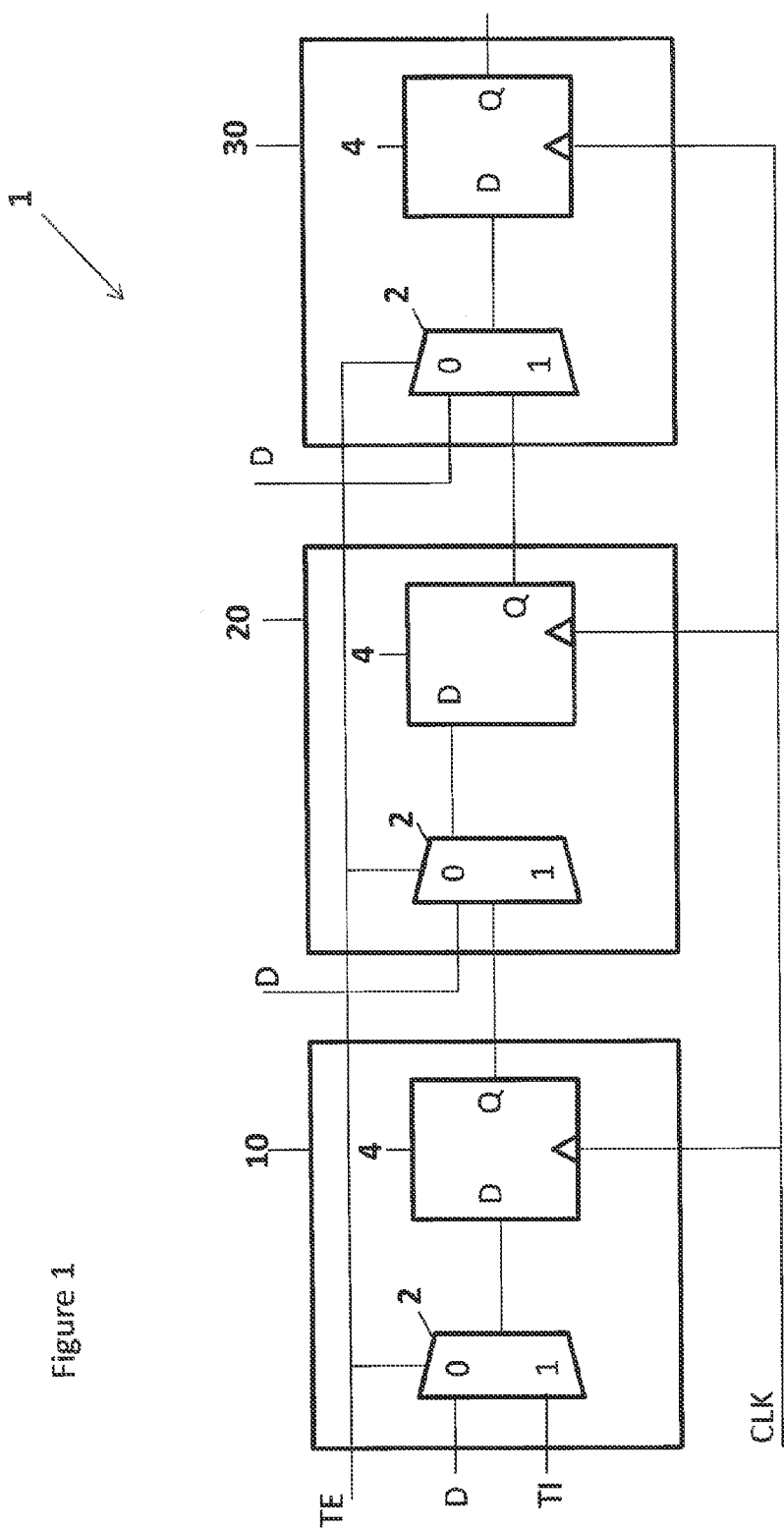
FIG. 1 schematically shows a scan chain.

Some embodiments may have scan chains for testing system on chip circuits or the like. Reference is made to FIG. 1 which schematically shows an integrated circuit or die 1 with a scan chain. The scan chain is schematically shown in FIG. 1. The scan chain comprises a plurality of scan blocks. In the example shown in FIG. 1, three scan blocks, 10, 20 and 30 are shown. In practice, the scan chains provided will be much larger. A scan chain can be any length. For example, some scan chains may have a very large number of scan blocks. Some scan chains may have tens of thousands of scan blocks.

Each scan block is provided with a flip-flop or similar element. In some embodiments, the flip-flop may be a D-type flip-flop. Each flip-flop 4 receives a clock signal at its clock input. In the example shown in FIG. 1, a common clock signal is applied to each of the flip-flops. However, it should be appreciated that in some embodiments, different flip-flops may receive different clock signals. Different ones of the scan blocks may be in different clock domains.

Each scan block comprises a multiplexer 2. The multiplexer 2 has one input which is configured to receive data D. The other input is configured to receive a test input TI. The multiplexer 2 of the first scan block 10 is arranged to receive test data from the test data source. This data comprises a test vector in the form of a stream of data which is clocked through the serially connected flip-flops. Thus, the output of each flip-flop is connected to the test input of the next scan block and so on.

In order to put the scan chain into the scan mode, a test enable signal is set to the scan mode. This causes the multiplexers 2 to select the test input data as the input to the flip-flop 4. The test vector is then scanned into this scan chain. In other words, in each successive clock cycle, the vector is shifted by one bit through the scan chain. At the end of the scan in mode, each flip-flop will have its respective bit of the test vector. The test enable signal is then de-asserted.

The chip is put into the functional mode configuration which means that the data input of each multiplexer is selected. The outputs of functional circuitry are then captured by the respective flip-flops. The scan chain is then put back in to the test mode and the values which are captured by the flip-flops are clocked out. This can be done at the same time that a new test vector is input.

Scan testing is used for testing digital integrated circuits. ATPG tools from CAD (computer aided design) vendors are used to generate the scan test patterns used with arrangements such as shown in FIG. 1.

VLSI (very large scale integration) testers are used to apply these scan test patterns to the device under test (DUT). During the development of the test program or during the testing of first silicon, or during the analysis of production issues, one or more devices are data logged. This may generate information such as a text file containing diagnostic failure data.

Figure 2:
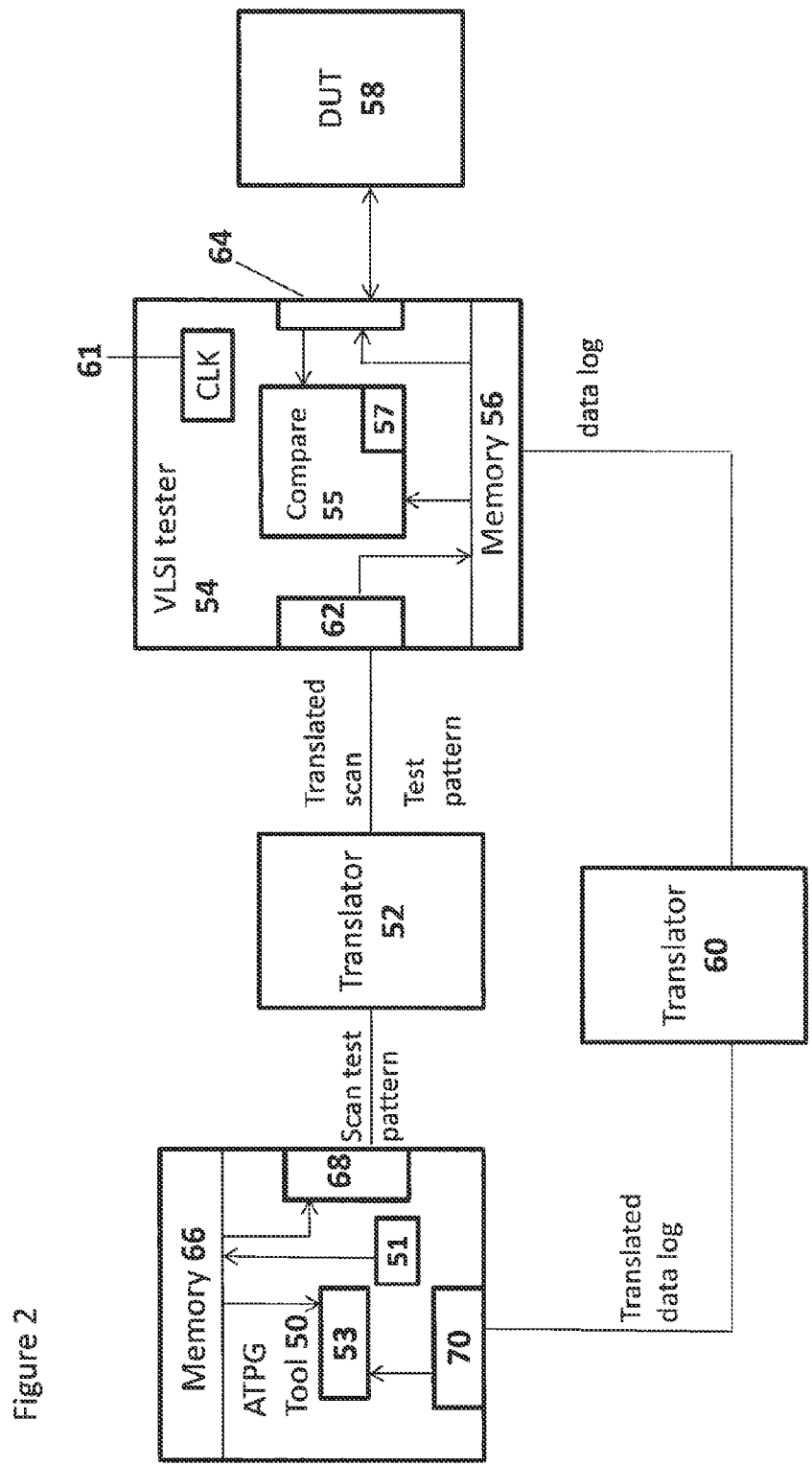
FIG. 2 schematically shows a test environment.

Reference is now made to FIG. 2 which schematically shows a testing arrangement. An ATPG tool 50 is provided. The ATPG tools create scan test patterns which can be saved out, for example in one or more industry standard formats. WGL (wave generation language) and STIL (standard test interface language) are two examples of industry standard file formats which are defined. For example STIL is defined in IEEE P1450.1. The test patterns may be stored in a memory 66 of the ATPG tool.

However, many VLSI testers cannot directly use these standard file formats or other outputs of the ATPG tool. The tester manufacturer or third party vendors may supply tools which read in the scan patterns from the ATPG tool, and then write out one or more files in the specific format required by the specific tester. Accordingly a translation function 52 is provided between the ATPG tool 50 and the VLSI tester 54. The ATPG tool has an output 68 from which the test patterns are output to the translator.

The ATPG has a test pattern generator 51 which creates scan test patterns composed of multiple vectors. A vector may correspond to one clock cycle, and contains the test values (for example both drive and compare) for a set of channels which may correspond one to one to the pins on the IC being tested. The test patterns are stored in the memory 66.

The VLSI tester 54 is used to apply scan test patterns via an interface 64 to the IC to be tested 58. The testing of an IC is performed by a test program. A test program may be made up from a set of DC tests and test patterns. The test patterns may include one or more of patterns testing the IC configured in the scan test mode, patterns testing the IC with the IC configured in a device specific test mode, and patterns testing the IC in its normal functional mode.

The VLSI tester 54 receives from the translator the translated test patterns via an interface 62 and stores the (translated) test patterns in a test vector memory 56. Each test vector may contain one or more values which determine whether the pin electronics for each channel (which connect to the pins of the IC) generate high or low drive data, generate a high going or low going clock pulse, test for a high value, a low value, or a tristate value, or do not drive and do not test in each cycle.

There is normally one to one correspondence to the vectors found in the ATPG scan test patterns and the translated data stored in the test vector memory 56 of the tester.

A master clock source 61 (which may be programmable) applies each set of data from the test vector memory to the device under test (DUT), until the vectors are exhausted. This may be indicated by a special value, terminal count, opcode or in any other suitable way.

The test vectors stored in the memory 56 of the tester 54 are applied by the tester 54 to the device under test. The response to each test vector is read out by the VLSI tester via the interface 64 and compared by a comparator 55 of the VLSI tester to an expected response stored in the memory 56. In some embodiments, the comparison carried out by the comparator may be done dynamically as the test vector is read in. If the response of the device to the stimulus from the test vector memory matches the expected values also found in the test vector memory, the DUT is considered to have passed this test.

The expected response is provided by the ATPG tool. The expected response will also be translated by the translator before being provided to the tester 54 and stored in the memory 56. The expected response may be provided with the test patterns or separately from the test patterns.

In some embodiments the memory 56 may be provided by a plurality of memories.

There may be many reasons why the application of a scan test pattern to a DUT would result in a fail result. In the cases where an analysis of the cause of the failure of the scan test pattern is required, the VLSI tester 54 will generate a datalog or other suitable information. In some embodiments, the datalog may be generated by a processing function 57 of the comparator 55. Alternatively or additionally, in other embodiments, one or more separate processors may be provided to generate the datalog. The processing function or processors are provided by suitable processing circuitry.

The datalog may be a file which contains fail information. The file may be a text file. Datalog formats can vary from each tester manufacturer. A datalog may contain one or more of a list of channels/pins which have had one or more mis-compares, the cycle number of each fail, together with the actual data value, sometimes giving the expected data value.

The ATPG tool may have an analyzer 53 which is configured to receive, for example, scan test fails (for example in an ATPG specific non-standard format) via input 70 and using the original scan test pattern, the ATPG tool performs an analysis to try to diagnose the cause of the fail. The information or datalog from the VLSI tester may be converted by a translator 60 to the file format expected by the ATPG tool.

As digital integrated circuits have become larger, there may be an issue with the efficiency of test, which can be measured in terms of test time (execution time of the test) and/or test vector memory usage. Generally the lower the execution time and/or the lower the amount of test vector memory usage the better.

During scan testing the flops are re-configured into serial scan chains which are repeatedly loaded with test data and unloaded with test results.

The total number of flip flops in system on chips has increased at a faster rate than the ability to efficiently inject scan test data into these flip flops, because more scan flip flops result in longer scan chains, hence longer test times and greater test vector memory usage.

Some embodiments may use time division multiplexing to multiply the number of input channels available for scan test purposes. This may provide an increase in the number of scan chains. This may result in an improvement in test efficiency.

In the scan testing configuration the flip flops which are used in the functional circuitry are reconfigured into one (or usually more) serial shift registers providing one or more scan chains. In the scan testing configuration, digital I/O (input/output) pads are reconfigured into scan I/O pads known as scan inputs and scan outputs.

In one example, scan inputs are used to inject data into the scan chains—there being a one to one correspondence in the number of scan inputs to the number of scan chains. Likewise there is a one to one correspondence in the number of scan outputs to the number of scan chains. In the scan testing configuration some digital I/O pads are used as for a scan clocks, scan reset, and scan control. A standard scan control pad would be known as scan enable, and has the function of switching all the scan flip flops between the functional configuration and the serial shift register ("scan mode") configuration.

There are other scan architectures in which the number of scan inputs does not match the number of scan chains. In these examples additional test circuitry has been added to decompress the scan in data and/or compress the scan out data or other unique scan test architectures.

Some embodiments may be used with either of the previously mentioned architectures.

Generally, it may be advantageous to have as many digital I/O pins re-purposed for scan purposes as possible. A requirement associated with scan testing is the number of clock cycles required to load all the scan chains. Generally, the length of all the scan chains may be balanced between the number of available scan ports (a scan port provides one scan input and one scan output).

Some available scan I/O are used for scan clocks, scan resets and scan control. The remaining scan I/O may be split in half and used as scan inputs and scan outputs. However, as SoCs get bigger, then usually more scan I/O are used for scan clocks, which then limits the number of scan I/O available for scan chains.

If the number of flip flops in the IC is nf and the number of scan in and scan out pairs (scan ports, usually the same number as number of scan chains) is ns, then the number of clock cycles required to load the scan chains with data would be nf/ns assuming a perfectly balanced set of scan chains. During the scan test of a SoC the scan chains are loaded and unloaded multiple (for example thousands) of times, hence the maximum length of the scan chains is of importance.

The problem encountered in testing ICs is that for each new generation of IC which increases in linear size by a factor of X, the number of flip flops nf is increasing at a faster rate (proportional to $X^2$) as compared to the number of pads and hence number of scan ports ns (which increases proportional to X).

The VLSI testers have a test vector memory into which many test data values are loaded. This memory is of limited size, but is often the most costly part of any VLSI tester. Each line of test vector memory maps to a single clock cycle during application of the test pattern to the device under test (DUT).

Each scan test pattern is made up a test initialization phase whose purpose is to put the IC into the scan testing mode, and a sequence of scan chain loads, scan capture test and scan chain unloads. The dominant usage of clock cycles and hence test vector memory is the scan chain load/unload (approximately nf/ns for well balanced scan chains). The time required to apply the test vectors to the DUT is directly proportional to the total number of test vectors used. The dominant factor which determines the number of scan test vectors is the load/unload cycles, which itself is determined by the scan chain length.

One way to reduce the (maximum) scan chain length is to allocate more scan I/O pads to scan input and scan output usage (e.g., increase ns). However, this may mean that the number of scan I/O allocated to scan clock and scan reset usage, has to be reduced.

For some ICs the number of scan I/O which need to be allocated to scan clocks and scan resets is also increasing as a result of more complicated IC architecture.

Inside a complicated IC often many circuits need to be clocks at different frequencies, often to meet industry standards (e.g., USB, PCI). The circuits which are clocked by the same clock frequency are known as "clock domains". During scan testing, one scan I/O scan clock pad may be allocated to each of the different internal clock domains. This requirement is a consequence of the different depths of clock tree for each of the clock domains. If the same scan clock were to be used for multiple clock domains, this may lead to a timing hazard during the scan capture phase of scan testing known as "shoot-through". This problem may be addressed by balancing the clock trees which are connected to the same scan clock, however there can be a high cost in silicon clock tree buffer overhead to achieve this. Consequently as the number of functional clock domains increase, the number of scan I/O needed to be allocated to scan clock usage may also increase.

Thus more scan clocks and/or more scan chains may be required to minimize test time, but the number of scan I/O is limited and shared between the two competing requirements.

Some embodiments may provide circuitry which may increase the number of both scan inputs and scan clocks and resets. The circuitry allows a scan I/O pad to be used as both a scan input and a scan clock/reset.

Consequently this may allow a greater number of scan chains and this in turn allows the maximum scan chain length to be reduced, resulting in reduced test vector usage, which in turn may lead to greater scan test efficiency and reduced test time.

Some embodiments take advantage of the standard order of events found during scan shift.

Figure 3:
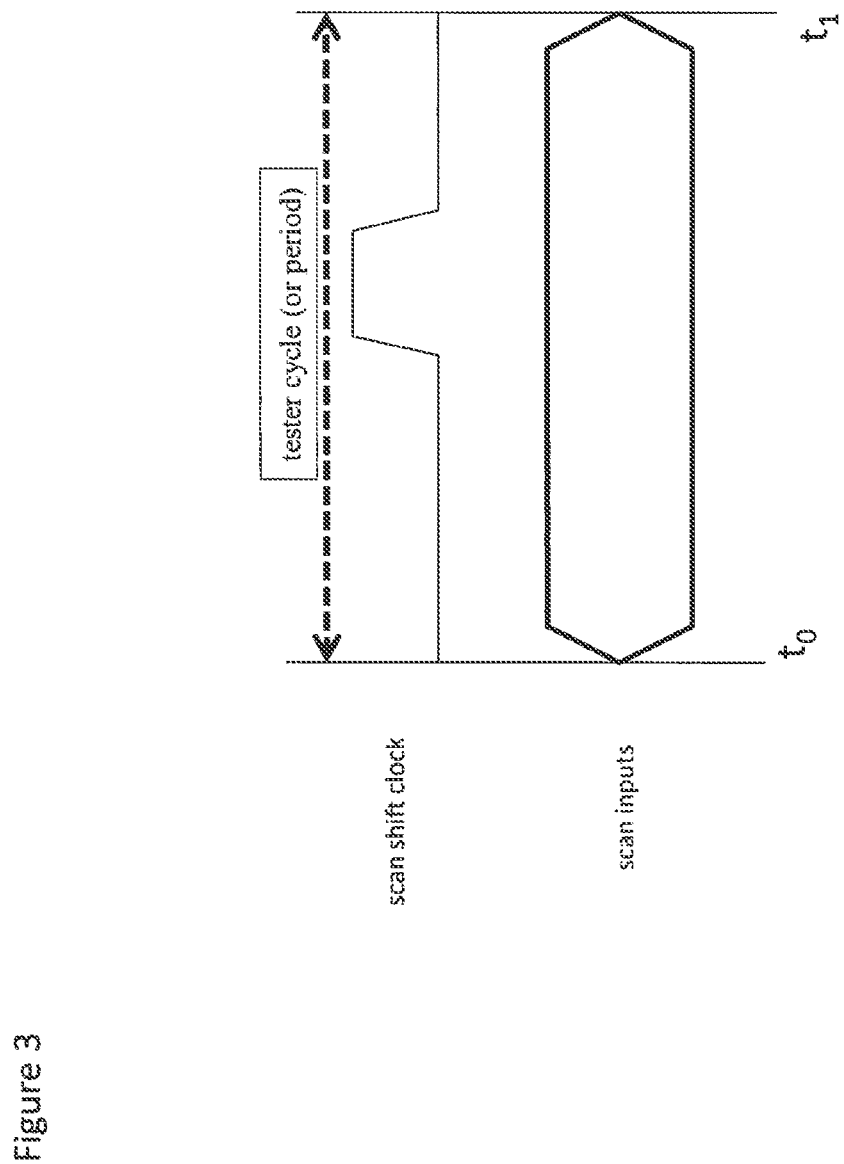
FIG. 3 shows a test cycle.

FIG. 3 shows the relationship between scan input timing and scan clock timing. The tester cycle or period is between time t0 and t1. The first line shows the scan clock which is pulsed high and then low again during the cycle.

The scan inputs are shown on the second line and are all driven with a '0' or '1' value at the start of each shift cycle.

In some scan architectures, the scan input data propagates through the scan in pad (which is configured into the input mode during the shift phase of testing) and eventually reaches the test input (SI) of the first scan flip flop in a scan chain. The scan clock propagates through the scan clock pad (which is configured into the input mode for all phases of scan testing) then sometimes through some test multiplexing and onto a functional clock tree and thereby to a set of scan (and possibly non-scan) flip flops.

Figure 4:
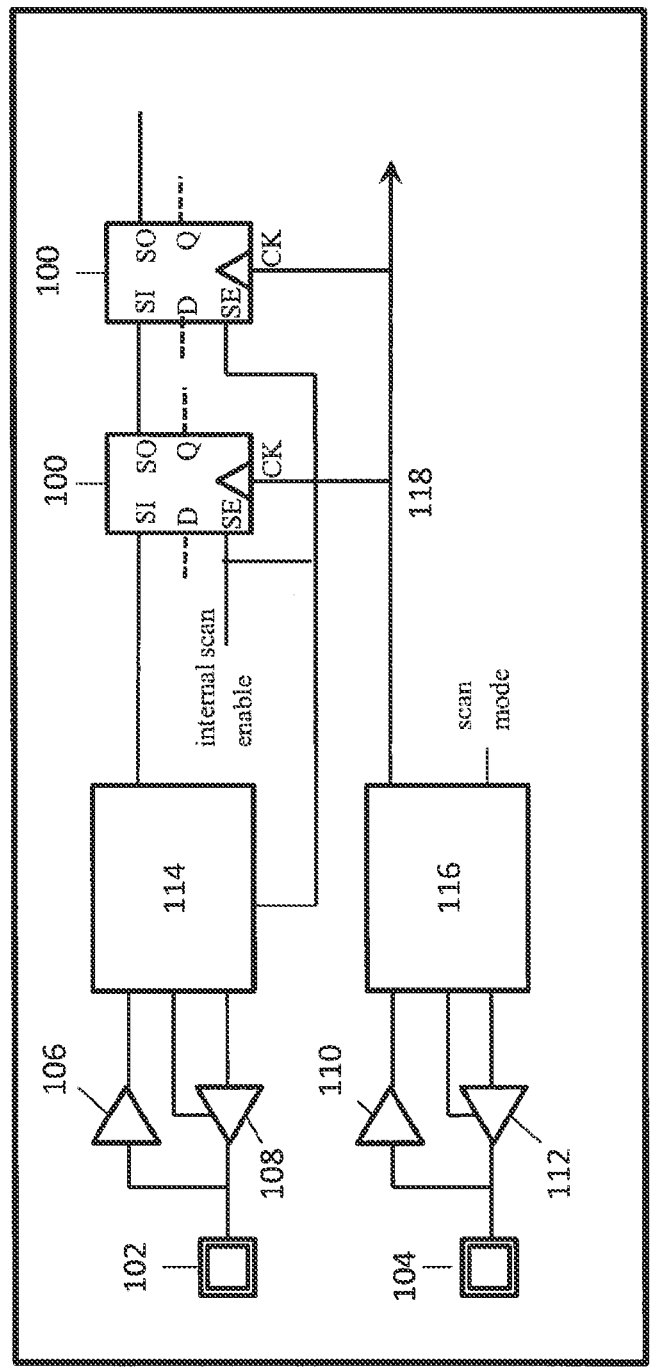
FIG. 4 shows schematically part of an integrated circuit or die.

FIG. 4 shows the arrangement between the scan clock pad 104 and scan in pad 102 and the first flip flop 100 in the scan chain. The flip flop has a normal data input D; a normal data output Q; a clock pin CK; a scan enable input SE; a scan input SI; and a scan output SO. The flip flop may have a reset pin (not shown). A second scan flip flop 100 has the same inputs and outputs as the first flip flop. The first and second flip flops have the same scan clock. The scan out SO output of the first flip flop is provided to the scan in SI port of the second flip flop.

Test "glue" circuitry 114 is provided between the scan in pad and the first flip flop. A first buffer 106 is provided for input signals between the scan in pad 102 and the test glue circuitry. A second buffer 108 is provided for output signals between the test glue circuitry 114 and the scan in pad. Test glue circuitry 116 is provided between the scan clock pad and the clock inputs of the flip flops. A third buffer 110 is provided for input signals and a fourth buffer 112 is provided for output signals. The third and fourth buffers 110 and 112 are provided between the scan clock pad and the test glue circuitry 116.

The test glue circuitry may be multiplexing circuitry in the pad logic which is enabled by test signals internal to the SoC and which when asserted put the pads into the scan configuration. Test glue circuitry is known in the art, and is not described in detail herein.

The SE input of all flip flops would normally all be connected to the same internal test signal called scan enable or shift enable. This signal is set to '1' in order to enable the scan shift configuration and is set to '0' for the scan capture (or functional) configuration. The scan enable may be controlled by a dedicated scan test pad. The test glue circuitry is used such that the internal scan enable is low during the functional operation of the IC.

The first flip flop in the scan chain has a more complicated timing requirement than flip flops internal to the scan chain because of the time it takes scan data to propagate from the pad to the first flip flop which in an IC might be some distance away.

The digital pad re-purposed as a scan clock is put into the input mode during the application of all scan patterns, which includes scan shift and the testing phase known as scan capture.

The digital pad re-purposed as a scan input is put into the input mode only during scan shift. In the FIG. 4, the internal scan enable is shown as enabling this pad mode.

In the embodiments which will be described now, have circuitry whereby the same pads can be used for both scan input purposes and also scan clock purposes. This may allow more scan input and scan output pairs, which in turn should lead to a reduced scan chain length, and the resulting efficiencies.

Figure 5:
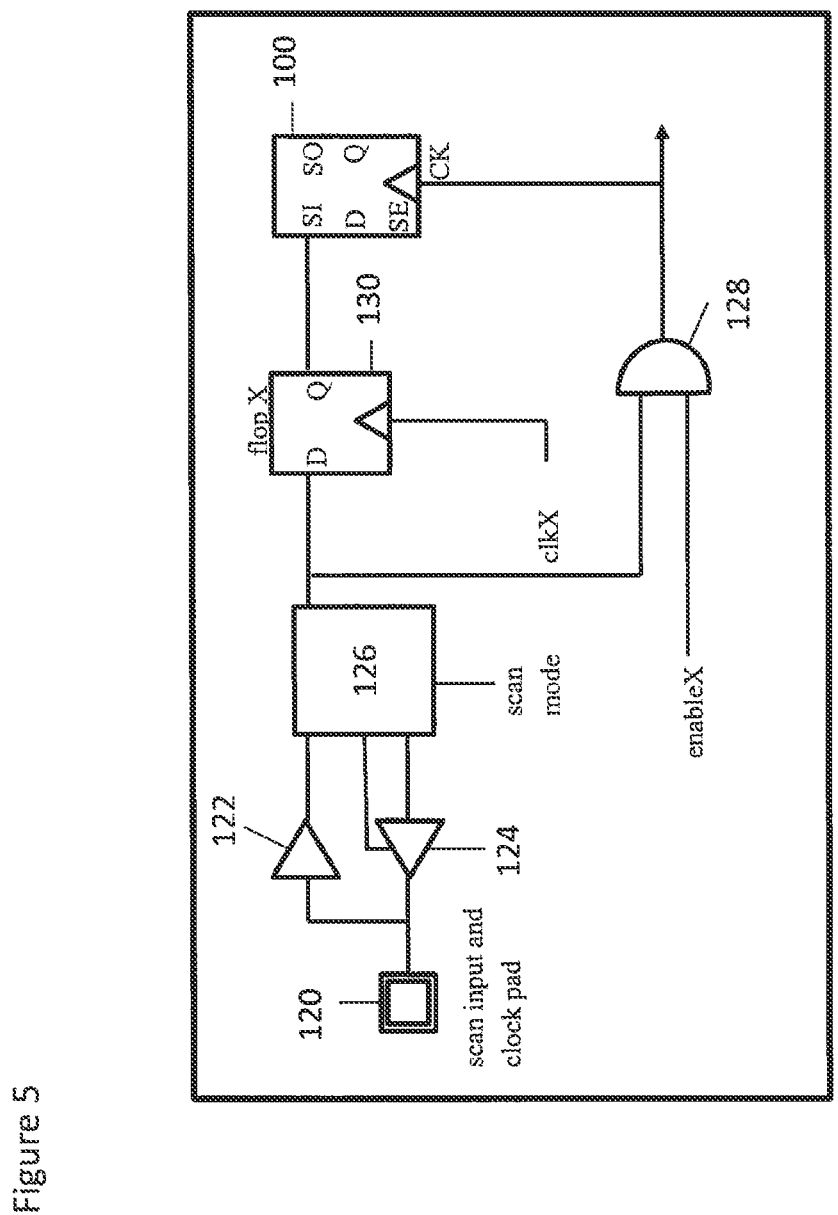
FIG. 5 shows schematically part of an integrated circuit or die of an embodiment.

Reference is made to FIG. 5 which shows a single pad providing a scan input and clock pad. Test glue circuitry 126 is provided with a first buffer 122 and a second buffer 124 between the test glue circuitry and the scan input and clock pad 120. The first buffer is for input data and the second buffer is for output data. An additional flip-flop 130 and a two input AND gate 128 is provided per scan in/clock pad. The flip flop 130 is shown as having in input D which receives an output of the test glue 126 and an output which is provided the scan input SI of the first flip flop 100 of the scan chain. The clock input of the flip flop 120 is clkX which will be described later in more detail. The AND gate 128 has its output provided to the clock input of each of the flip flops of the scan chain. The AND gate has a first input enable X which will be described later in more detail and a second input which is provide by the test glue. The test glue is controlled by a scan mode signal. Each scan I/O modified in this way can be used as a scan clock and a scan input.

Figure 6:
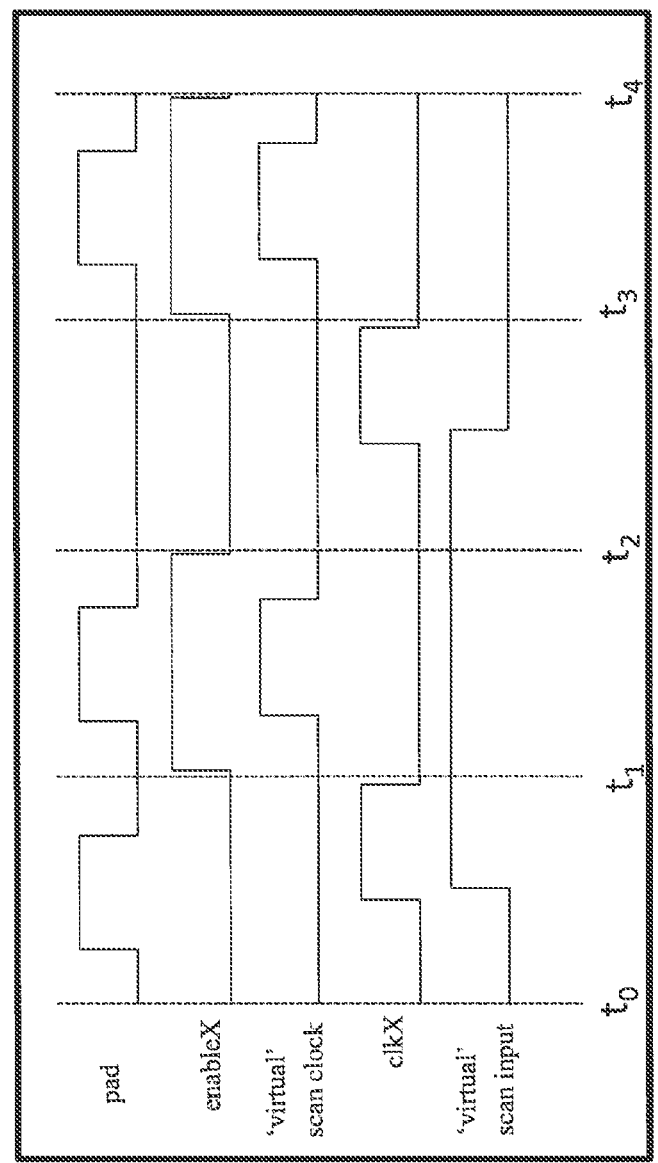
FIG. 6 shows a first timing diagram for the arrangement of FIG. 5.

Reference is made to FIG. 6 which shows a timing diagram for the arrangement of FIG. 5. The first line shows the pad signals, the second line shows the signal enable X, the third line shows the virtual scan clock (the scan clock output by the AND gate, the fourth link shows clkX, the fifth line shows the virtual scan input (the output provided by the flip flop 130).

The timing diagram shows the waveforms and timing of clkX and enable X in order to generate the derived virtual scan input and virtual scan clock. In this diagram four tester cycles are shown. This equates to two virtual scan cycles.

The first two cycles show the waveform on the shared pad which will make the virtual scan input '1' while generating a clock pulse on the virtual scan clock.

In each of the first two cycles the input is toggled from low to high and back to low again. The enable X signal is low for the first cycle and high for the second cycle. This means the output of the AND gate (virtual scan clock) is low for the first cycle and will go high in the second cycle when the pad signal is high. The clock signal clkX will be low for the first half of the first cycle and high for the second half and is low for the whole of the second cycle. The virtual scan input will thus be low for the first half of the first cycle (because the clock signal is low) but will be high in the second half of the first cycle because the clock signal clkX is high and the pad signal is high. The virtual scan input remains high for the second cycle while the clkX is low.

The next two cycles show the waveform on the shared pad which will make the virtual scan input '0' while generating a clock pulse on the virtual scan clock.

In the third cycle, the input to the pad is low and in the fourth cycle the input is toggled from low to high and back to low again. The enable X signal is low for the third cycle and high for the fourth cycle. This means the output of the AND gate (virtual scan clock) is low for the third cycle and will go high in the fourth cycle when the pad signal is high. The clock signal clkX will be low for the first half of the third cycle and high for the second half and is low for the whole of the fourth cycle. The virtual scan input will thus be high for the first half of the third cycle (because the clock signal is still low) but will be low in the second half of the third cycle because the clock signal clkX is high and the pad signal is low. The virtual scan input remains low for the fourth cycle while the clkX is low.

It can be observed that the sequencing or timing setup time of the virtual scan input before the virtual scan clock is maintained.

In this example the gain of number of virtual scan inputs and virtual scan clocks may be at the expense of the number of test vectors (which is doubled). This may be acceptable for devices with smaller test vector requirements. The waveform on the (shared) pad may compatible with all tester types.

Figure 7:
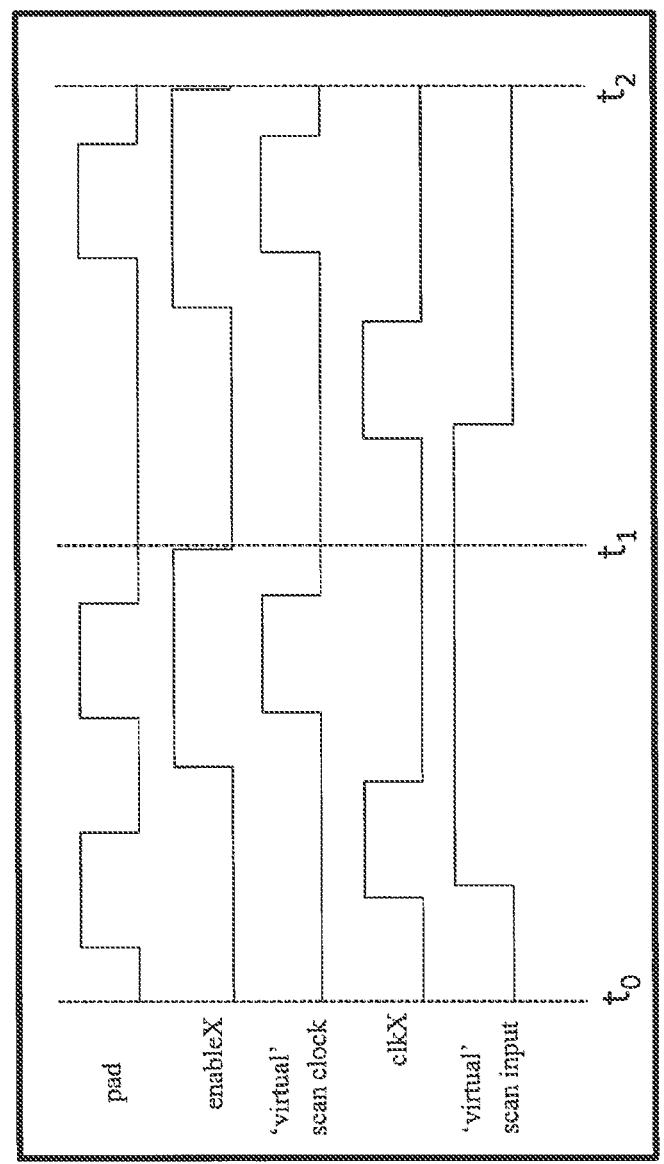
FIG. 7 shows a second timing diagram for the arrangement of FIG. 5.

Reference is made to FIG. 7 which shows a timing diagram waveforms and timing of clkX and enableX in order to generate the derived virtual scan input and virtual scan clock on a more timing flexible tester. The first line shows the pad signals, the second line shows the signal enable X, the third line shows the virtual scan clock (the scan clock output by the AND gate), the fourth line shows clkX, the fifth line shows the virtual scan input (the output provided by the flip flop 130).

In this Figure two tester cycles are shown. This equates directly to two virtual scan cycles.

The first cycle shows the waveform on the shared pad which will make the virtual scan input '1' while generating a clock pulse on the virtual scan clock. In the first cycles the input is toggled from low to high and back to low twice. The enable X signal is low for the first half of the first cycle and high for the second half of the first cycle. This means the output of the AND gate (virtual scan clock) is low for the first half of the first cycle and will go high in the second half of the first cycle when the pad signal is high. The clock signal clkX will be low for the first quarter of the first cycle and high for the second quarter and is low for the whole of the second half of the first cycle. The virtual scan input will thus be low for the first quarter of the first cycle (because the clock signal is low) but will be high in the remainder of the first cycle because the clock signal clkX is high and the pad signal is high. The virtual scan input remains high for the second half of the first cycle while the clkX is low.

The next cycle shows the waveform on the shared pad which will make the virtual scan input '0' while generating a clock pulse on the virtual scan clock.

In the first half of the second cycle, the input to the pad is low and in the last half of the cycle the input is toggled from low to high and back to low again. The enable X signal is low for the first half of the second cycle and high for the second half of the cycle. This means the output of the AND gate (virtual scan clock) is low for the first half of the second cycle and will go high in the second half of the second cycle when the pad signal is high. The clock signal clkX will be low for the first quarter of the second cycle, high for the second quarter and is low for the whole of the second half of the second cycle. The virtual scan input will thus be high for the first quarter of the second cycle (because the clock signal is still low) but will be low in the rest of the second cycle, because the clock signal clkX is high and the pad signal is low and the clkX is low.

The sequencing or timing setup time of the virtual scan input before the virtual scan clock is maintained in this example.

In this example the gain of number of virtual scan inputs and virtual scan clocks does not impact the test vector requirements. Embodiments may be used with a tester having the capability of generating several events per cycle.

It can be observed that the waveform shape on pad in cycle one appears like a double clock pulse, whereas the waveform shape on pad in cycle two appears like a single clock pulse. A number of testers have the capability of generating one or more clock pulses per tester cycle. Some embodiments may make use of the capability of this type of tester.

In one embodiment, enableX and clkX would both come from dedicated re-purposed digital I/O pads which are configured into input mode by the test signal scan mode. The necessary waveforms for these two test signals are straight forward for any test system to generate regardless of the type or capability of the tester.

In some embodiments, the delay from these auxiliary scan test pads to all the gating AND gates 128 and all the latching flip flops 130 is kept low and well balanced. Dedicating two scan test pads to be used to generate these enableX and clkX may not be a large overhead.

In some embodiments, suitable circuitry may be provided by a device under test to generate clkX and enable X.

In some embodiments, the ATPG tool is configured to generate the test pattern data which comprises scan data merged with the clock signal for application to the same input pad. The test pattern data is generated by the test pattern generator 51.

In some embodiments, the ATPG tool may not have the capability to merge the scan data and the clock signal such that the scan data is multiplexed with the clock data when the test pattern is applied to a scan pad. In those embodiments, an additionally translator may be provided between the output of the ATPG tester and the input to the translator 52 which would merge the scan and clock data.

In other embodiments, the translator 52 may have the capability to merge the scan data and the clock signal.

A CAD/EDA (electronic design automation) tool may have the ability to insert circuitry such as previously described in a circuit design. This may be done automatically, for example during scan insertion/hook-up.

The device under test has been described as an integrated circuit. In other embodiments, the device under test may be a die.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
a first input pad configured to receive a multiplexed signal including scan data and clock data;
a scan chain having a scan data input and a clock input; and
circuitry coupled between said first input pad and said scan chain and configured to:
extract the scan data and a clock signal from the received multiplexed signal;
provide the extracted scan data to the scan data input of the scan chain; and
provide the extracted clock signal to the clock input of the scan chain.

2. The circuit of claim 1 wherein the circuitry comprises:
logic having an enable input and a second input coupled to said first input pad and configured to provide the extracted clock signal to the clock input of the scan chain.

3. The circuit of claim 2, comprising:
an enable-signal input pad configured to receive an enable signal, the enable-signal input pad being coupled to the enable input of the logic.

4. The circuit of claim 2 wherein said logic comprises an AND gate.

5. The circuit of claim 2 wherein the circuitry comprises:
a flip flop, a data input of said flip flop configured to receive said multiplexed signal and a data output of said flip flop configured to provide the extracted scan data to the scan data input of the scan chain.

6. The circuit of claim 5 wherein a clock input of said flip flop is configured to receive a control clock signal.

7. The circuit of claim 6, comprising:
a control-clock input pad configured to receive said control clock signal and coupled to the clock input of the flip flop.

8. The circuit of claim 7, comprising:
an enable-signal input pad configured to receive an enable signal, the enable-signal input pad being coupled to the enable input of the logic.

9. The circuit of claim 1 wherein the circuit is at least one of:
an integrated circuit; and
a die.

10. The circuit of claim 1 wherein the first input pad is configured to receive the multiplexed signal from a testing apparatus and the circuitry is configured to extract one value of a scan vector and an associated clock pulse from the multiplexed signal in each cycle of the tester.

11. The circuit of claim 1 wherein the first input pad is configured to receive the multiplexed signal from a testing apparatus and the circuitry is configured to extract one value of a scan vector and an associated clock pulse from the multiplexed signal every two cycles of the tester.

12. A method, comprising:
receiving a multiplexed signal including scan data and clock data on a first input pad of a circuit;
extracting the scan data from the received multiplexed signal;
extracting a clock signal from the received multiplexed signal;
providing the extracted scan data to a scan data input of a scan chain of the circuit; and
providing the extracted clock signal to a clock input of the scan chain of the circuit.

13. The method of claim 12, comprising:
extracting the clock signal from the multiplexed signal based on an enable signal.

14. The method claim 13, comprising:
receiving the enable signal on an enable-signal input pad of the circuit.

15. The method of claim 14, comprising:
extracting the scan data based on a control-clock signal.

16. The method of claim 15, comprising:
receiving the control-clock signal on a control-clock-signal input pad of the circuit.

17. The method of claim 12, comprising:
generating the multiplexed signal using a testing apparatus coupled to the circuit; and
extracting one value of a scan vector and an associated clock pulse from the multiplexed signal in each cycle of the testing apparatus.

18. The method of claim 12, comprising:
generating the multiplexed signal using a testing apparatus coupled to the circuit; and
extracting one value of a scan vector and an associated clock pulse from the multiplexed signal in every two cycles of the testing apparatus.

19. A system, comprising:
test signal generation circuitry, which, in operation, generates a multiplexed signal including scan data and clock data;
a first input pad, which, in operation, receives the multiplexed signal;
a scan chain having a scan data input and a clock input; and
circuitry coupled between said first input pad and said scan chain, which, in operation,
extracts the scan data and a clock signal from the received multiplexed signal;
provides the extracted scan data to the scan data input of the scan chain; and
provides the extracted clock signal to the clock input of the scan chain.

20. The system of claim 19, comprising:
an integrated circuit including the first input pad, the scan chain and the circuitry coupled between the first input pad and the scan chain.

21. The system of claim 19 wherein the circuitry coupled between the first input pad and the scan chain comprises a flip-flop, which, in operation, receives the multiplexed signal at a data input of the flip-flop and provides the extracted scan data at a data output of the scan chain.

22. A non-transitory computer-readable medium having contents which cause a circuit to respond to a multiplexed signal including scan data and clock data received on a first input pad of the circuit by performing a method, the method comprising:
extracting the scan data from the multiplexed signal received on the first input pad;
extracting a clock signal from the multiplexed signal received on the first input pad;
providing the extracted scan data to a scan data input of a scan chain of the circuit; and
providing the extracted clock signal to a clock input of the scan chain of the circuit.

23. The computer-readable medium of claim 22 wherein the method comprises:
extracting the clock signal from the multiplexed signal based on an enable signal.

24. The computer-readable medium of claim 22 wherein the method comprises:
extracting the scan data based on a control-clock signal.

* * * * *